(12) United States Patent
Harding (10) Patent No.: US 10,109,682 B2
(45) Date of Patent: Oct. 23, 2018

(54) PRODUCTION OF TRANSISTOR ARRAYS (71) Applicant: FLEXENABLE LIMITED, Cambridge (GB)

(72) Inventor: Matthew James Harding, Cambridge (GB)

(73) Assignee: FLEXENABLE LIMITED, Cambridge (GB)

( * ) Notice: Subject to any disclaimer, the term of this patent is extended or adjusted under 35 U.S.C. 154(b) by 0 days.

(21) Appl. No.: 15/312,285

(22) PCT Filed: May 20, 2015

(86) PCT No.: PCT/EP2015/061167
§ 371 (c)(1),
(2) Date: Nov. 18, 2016

(87) PCT Pub. No.: WO2015/177240
PCT Pub. Date: Nov. 26, 2015

(65) Prior Publication Data
US 2017/0110516 A1 Apr. 20, 2017

(30) Foreign Application Priority Data
May 20, 2014 (GB) .................................. 1408961.9

(51) Int. Cl.
*H01L 27/12* (2006.01)
*H01L 51/05* (2006.01)
(Continued)

(52) U.S. Cl.
CPC .......... *H01L 27/283* (2013.01); *H01L 27/124* (2013.01); *H01L 27/127* (2013.01); *H01L 27/1218* (2013.01); *H01L 51/0003* (2013.01)

(58) Field of Classification Search
CPC . H01L 27/124; H01L 27/1218; H01L 27/127; H01L 27/283; H01L 51/0021;
(Continued)

(56) References Cited

U.S. PATENT DOCUMENTS 7,718,077 B1 * 5/2010 Kim ....................... B82Y 10/00
216/11
8,110,432 B1 * 2/2012 Marks ................... H01L 51/102
257/E21.259
(Continued)

FOREIGN PATENT DOCUMENTS

WO  2004/055920 A2  7/2004
WO  2006/097304 A1  9/2006
(Continued)

OTHER PUBLICATIONS

Written Opinion of the International Searching Authority of PCT/EP2015/061167 dated Aug. 6, 2015.
(Continued)

*Primary Examiner* — Maliheh Malek
(74) *Attorney, Agent, or Firm* — Sughrue Mion, PLLC (57) ABSTRACT

A method of producing a transistor array, comprising an array of addressing conductors each providing the source electrodes of a respective set of transistors and at least part of a conductive connection between a respective driver terminal and said source electrodes; wherein the method comprises: forming a conductor layer on a support; and displacing a plurality of portions of said conductor layer relative to other portions of said conductor layer to create from said conductor layer at least (i) said array of addressing conductors and an array of drain conductors at said first level, (ii) conductor element islands in transistor channel regions at a second level, and (iii) one or more further conductor elements at a third level.

18 Claims, 6 Drawing Sheets

(51) Int. Cl.
*H01L 25/03* (2006.01)
*H01L 27/28* (2006.01)
*H01L 51/00* (2006.01)
H01L 27/02 (2006.01)
H01L 25/04 (2014.01)

(58) Field of Classification Search
CPC ............ H01L 51/0023; H01L 51/0014; H01L 51/0545; H01L 51/0015; H01L 2251/105; H01L 25/0655; H01L 25/072; H01L 25/105; H01L 25/11; H01L 25/112; H01L 25/115; H01L 25/16; H01L 25/18; H01L 25/50; H01L 27/3237–27/3297
See application file for complete search history.

(56) References Cited

U.S. PATENT DOCUMENTS

| | | | | |
|---|---|---|---|---|
| 9,123,752 | B2* | 9/2015 | Shimoda | C01G 25/00 |
| 9,331,132 | B2* | 5/2016 | Reynolds | H01L 27/3262 |
| 2004/0075155 | A1 | 4/2004 | Huang et al. | |
| 2005/0142714 | A1* | 6/2005 | Chae | H01L 27/1288 438/197 |
| 2005/0202350 | A1* | 9/2005 | Colburn | B82Y 10/00 430/320 |
| 2005/0258571 | A1* | 11/2005 | Dumond | B81C 99/0085 264/293 |
| 2005/0266693 | A1* | 12/2005 | Maekawa | B82Y 10/00 438/720 |
| 2005/0275020 | A1* | 12/2005 | Kyozuka | H01L 21/28264 257/347 |
| 2007/0070287 | A1* | 3/2007 | Lee | G02F 1/133753 349/156 |
| 2008/0006161 | A1* | 1/2008 | Li | B82Y 10/00 101/32 |
| 2008/0008824 | A1* | 1/2008 | Cho | H05K 1/09 427/98.2 |
| 2008/0012151 | A1* | 1/2008 | Kemppainen | H01L 51/0021 257/786 |
| 2008/0034581 | A1* | 2/2008 | Ra | H05K 3/0014 29/834 |
| 2008/0264672 | A1* | 10/2008 | Markley | B82Y 10/00 174/250 |
| 2008/0265338 | A1* | 10/2008 | Yu | H01L 29/66795 257/397 |
| 2009/0038683 | A1* | 2/2009 | Walter | H01L 51/0015 136/263 |
| 2009/0065767 | A1* | 3/2009 | Reynolds | H01L 27/3262 257/40 |
| 2009/0127563 | A1* | 5/2009 | Bae | G02F 1/136227 257/72 |
| 2010/0127250 | A1* | 5/2010 | Salzillo | H01L 51/0023 257/40 |
| 2010/0148407 | A1* | 6/2010 | Park | B29C 33/424 264/496 |
| 2010/0149481 | A1* | 6/2010 | Lee | G02F 1/1333 349/187 |
| 2011/0140303 | A1* | 6/2011 | Jang | B82Y 10/00 264/293 |
| 2011/0303917 | A1* | 12/2011 | Lee | H01L 27/12 257/59 |
| 2013/0256937 | A1* | 10/2013 | Philippot | H01L 51/0023 264/104 |
| 2014/0077193 | A1 | 3/2014 | Lee | |
| 2014/0215805 | A1* | 8/2014 | Zhang | H05K 1/0218 29/593 |
| 2014/0339550 | A1* | 11/2014 | Shimoda | C01G 25/00 257/43 |
| 2015/0155493 | A1* | 6/2015 | Cheng | H01L 51/56 438/35 |
| 2015/0220181 | A1* | 8/2015 | Jung | G06F 3/044 345/174 |
| 2016/0056379 | A1* | 2/2016 | Brug | H01L 51/0012 257/40 |
| 2016/0161819 | A1* | 6/2016 | Fichet | G02F 1/133514 359/296 |
| 2016/0183895 | A1* | 6/2016 | Harding | G01T 1/24 378/62 |
| 2016/0211383 | A1* | 7/2016 | Harding | G06F 3/0412 |
| 2016/0233237 | A1* | 8/2016 | Riedel | H01L 27/124 |
| 2016/0233254 | A1* | 8/2016 | Riedel | H01L 27/124 |
| 2016/0275862 | A1* | 9/2016 | Riedel | G09G 3/20 |
| 2016/0308153 | A1* | 10/2016 | Jongman | H01L 51/055 |
| 2016/0322503 | A1* | 11/2016 | Tezuka | H01L 29/7869 |
| 2016/0372488 | A1* | 12/2016 | Riedel | H01L 27/124 |
| 2017/0048977 | A1* | 2/2017 | Siddique | H05K 3/323 |
| 2017/0179231 | A1* | 6/2017 | Jongman | H01L 29/1054 |

FOREIGN PATENT DOCUMENTS

| | | | | |
|---|---|---|---|---|
| WO | WO 2006097304 A1 * | 9/2006 | ....... | H01L 29/66757 |
| WO | 2007/074404 A2 | 7/2007 | | |

OTHER PUBLICATIONS

International Search Report of PCT/EP2015/061167 dated Aug. 6, 2015.

* cited by examiner

PRODUCTION OF TRANSISTOR ARRAYS

CROSS REFERENCE TO RELATED APPLICATIONS

This application is a National Stage of International Application No. PCT/EP2015/061167 filed May 20, 2015, claiming priority based on British Patent Application No. 1408961.9 filed May 20, 2014, the contents of all of which are incorporated herein by reference in their entirety.

Transistor arrays are used, for example, in pixellated display devices to control the optical output of an array of pixels. The optical output of each pixel may be controlled by one or more transistors associated with the pixel.

A transistor array may be defined by a stack of layers including a conductor layer providing at least an array of addressing conductors, each addressing conductor providing at least part of a conductive connection between a respective driver terminal and the semiconductor channels of a respective set of transistors.

A conventional technique for producing an array of addressing conductors is to deposit a continuous layer of conductor material and then pattern the layer of conductor layer of material by removing selected portions of the conductor layer by e.g. photolithography.

It is an aim of the present invention to provide an alternative technique for producing an array of addressing conductors.

The present invention provides a method of producing a transistor array, comprising an array of addressing conductors each providing the source electrodes of a respective set of transistors and at least part of a conductive connection between a respective driver terminal and said source electrodes; wherein the method comprises: forming a conductor layer on a support; and displacing a plurality of portions of said conductor layer relative to other portions of said conductor layer to create from said conductor layer at least (i) said array of addressing conductors and an array of drain conductors at said first level, (ii) conductor element islands in transistor channel regions at a second level, and (iii) one or more further conductor elements at a third level.

In one embodiment, the second level is between the first and third levels.

In one embodiment, the distance between the first and second levels is smaller than the distance between the second and third levels.

In one embodiment, the method further comprises: depositing a substantially continuous layer of semiconductor channel material over the arrays of source and drain conductors, the conductor element islands and the further conductor elements; and selectively decreasing the conductivity of the layer of semiconductor channel material in one or more regions over the one or more further conductor elements at the third level.

In one embodiment, selectively decreasing the conductivity of the layer of semiconductor channel material in one or more regions over the one or more additional conductor elements comprises removing portions of the layer of semiconductor channel material in one or more regions over the one or more further conductor elements.

In one embodiment, the method further comprises forming a gate dielectric layer or stack of gate dielectric layers over at least the semiconductor islands, and forming an array of gate conductors over the gate dielectric layer or stack of gate dielectric layers for capacitative coupling with the semiconductor islands in at least the channel regions.

There is also hereby provided a transistor array, comprising; a first conductor pattern at a first level defining an array of source and drain conductors, each source conductor providing the source electrodes of a respective set of transistors and at least part of a conductive connection between a respective driver terminal and said source electrodes; a second conductor pattern at a second level defining an array of conductor islands in channel regions; a third conductor pattern at a third level, wherein the first, second and third conductor patterns form a complementary set of patterns; semiconductor channels between source and drain conductors in said channel regions; and one or more gate conductors capacitatively coupled to said semiconductor channels via a gate dielectric.

In one embodiment, the second level is between the first and third levels.

In one embodiment, the distance between the first and second levels is smaller than the distance between the second and third levels.

Embodiments of the present invention are described in detail hereunder, by way of example only, with reference to the accompanying drawings, in which.

An example of a technique according to an embodiment of the invention is described for the example of a relatively simple transistor array for a pixellated display device, in which the transistor array defines only a single, respective transistor for each pixel. However, the technique may also be used, for example, for (a) the production of more complex transistor arrays that define a respective group of transistors for each pixel, or (b) the production of simple or complex transistor arrays for other pixellated devices such as sensors.

Figure 1:
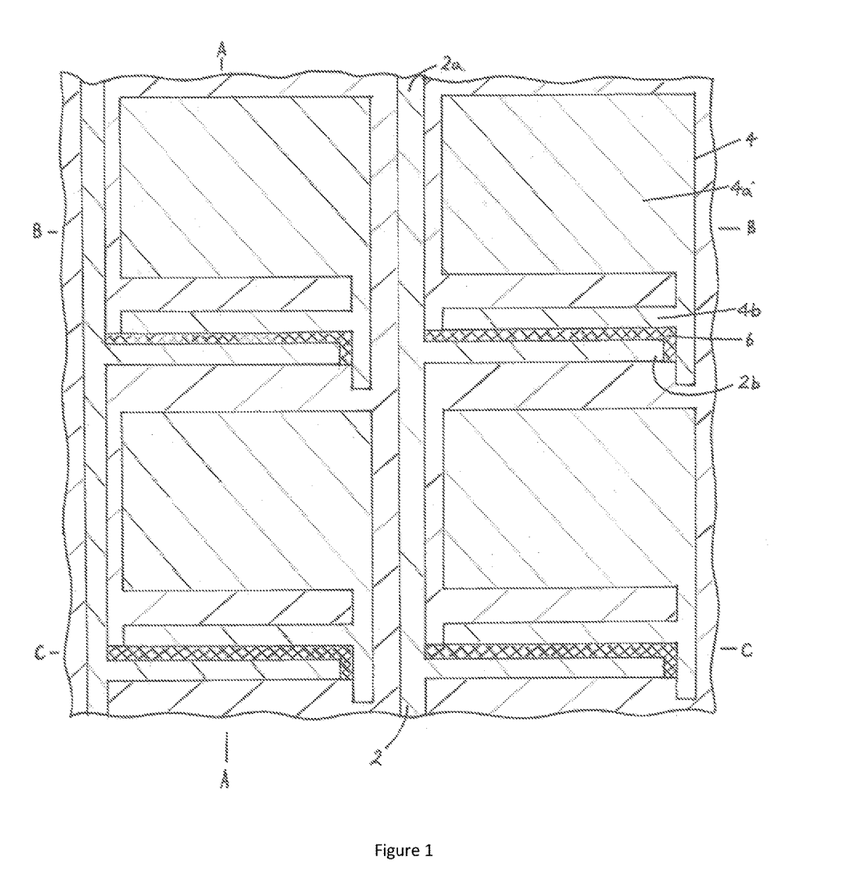
FIG. 1 illustrates a plan view of a conductor array produced according to an embodiment of the present invention.
Figure 2:
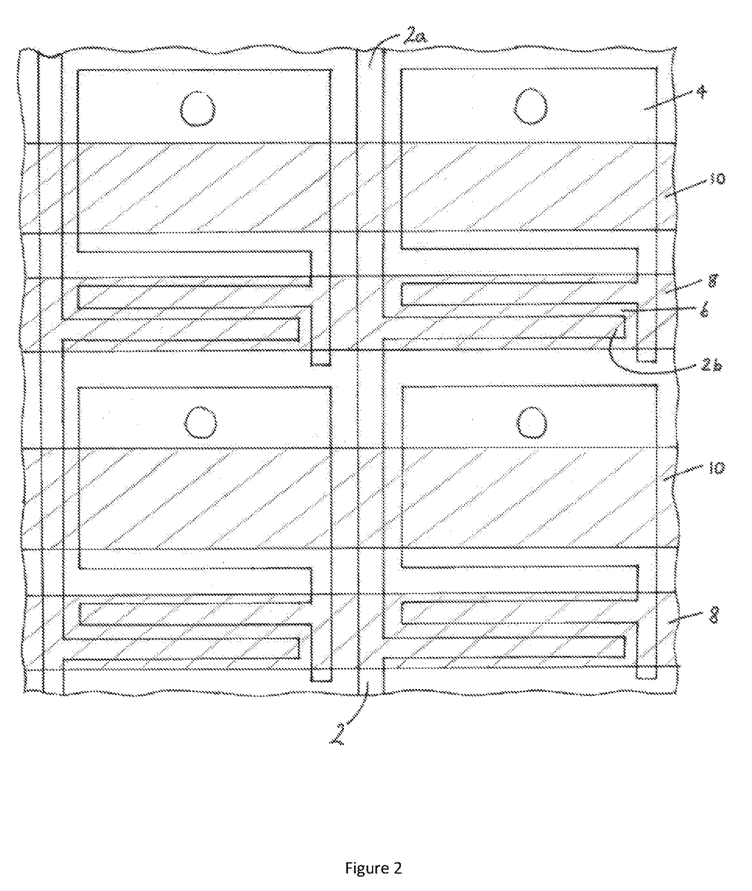
FIG. 2 illustrates the provision of gate lines and COM lines in combination with the conductor array of FIG. 1.
Figure 3A:
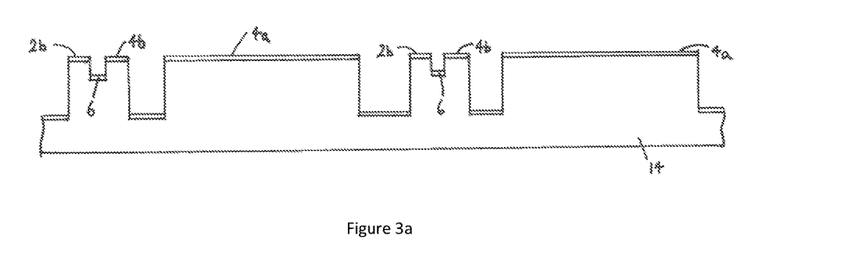
FIGS. 3(a) to 3(c) show cross-sections taken through lines A-A, B-B and C-C of FIG. 1, respectively.
Figure 3B:
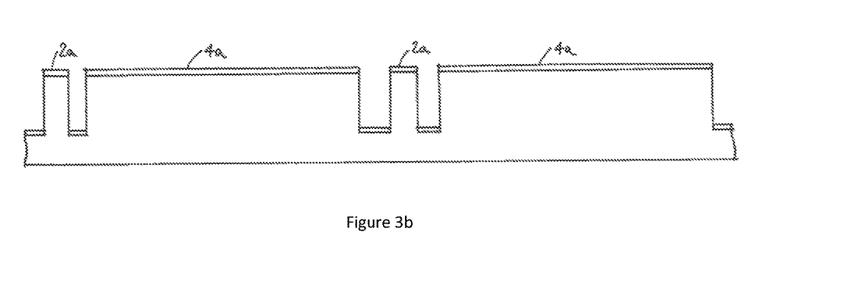
Figure 3C:
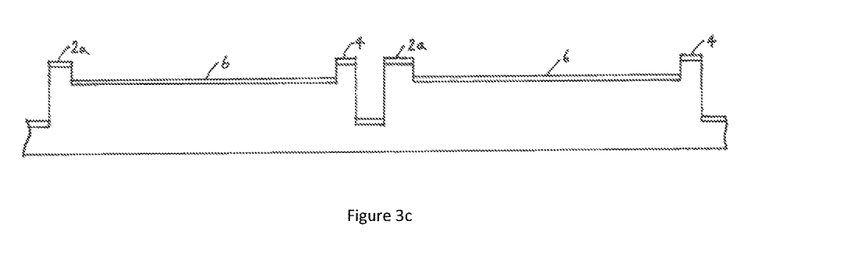

FIGS. 1 and 2 show the main conductor elements for only four pixels, but the technique can be used to produce large transistor arrays comprising transistors for more than a million pixels.

With reference to FIGS. 1 to 4, the technique involves depositing a thin layer of conductor material 12 on a substrate 14, which may for example comprise an uppermost layer of solid but relatively deformable material (such as a thermoplastic resin) on a relatively hard lower support. A relatively hard mold 16 (harder than the layer of deformable material) is then used to forcibly depress selected portions of the conductor layer and the deformable layer in a direction substantially perpendicular to the plane of the first conductor layer and create conductor elements at three different levels, as shown by different types of hatching in FIG. 1. In this example, the first upper level defines (a) an array of source conductors 2 each providing (i) source electrodes 2b of a respective column of transistors and (ii) an addressing line 2a providing at least part of a conductive connection between said source electrodes 2b and a respective terminal of a source driver chip 30; and (b) drain conductors 4 each providing a drain electrode 4b in very close proximity (e.g. about 20 microns) to a respective source electrode 2b and connected to a larger area conductor 4a which can, for example, serve as a pad for an interlayer connection to a respective, upper pixel conductor (not shown). The second, middle level defines conductor islands 6 in the channel regions in between each pair of source and drain electrodes 2b, 4b. The third, lower level comprises the remainder of the conductor layer including all of the conductor layer in regions between source conductors 2 and drain conductors 4 outside the channel regions. In this example, the channel regions are those regions where conductor islands 6 are formed. The conductor islands 6 extend substantially the full width (distance along which the source and drain electrodes 2b, 4b are in close proximity) of the channel between the source and drain electrodes 2b, 4b of a transistor. As described below, semiconductor islands are formed in these channel regions and gate line conductors overlap said channel regions.

There is no conductive connection between any two of the three levels. There is no conductive connection between each conductor island 6 and the respective associated pair of source and drain electrodes 2b, 4b; there is no conductive connection between the conductor islands 6 and the conductor elements at the third, lower level; and there is no conductive connection between any of the source and drain conductors 2, 4 and the conductor elements at the third, lower level.

As illustrated in FIG. 1, the three conductor patterns at the first, second and third levels form a complementary set of conductor patterns; any two of the three conductor patterns exactly match the gaps in the remaining one of the three conductor patterns without any overlap of the three conductor patterns.

This process of displacing selected portions of the first conductor layer to create conductor elements at at least three different levels may be implemented, for example, by a technique comprising: providing an assembly including a thin gold film (as the first conductor layer) supported on a substrate via a layer of Parylene C, forcibly applying the protrusions of the stamp/mold to the upper surface of the assembly and down into the layer of Parylene C whilst holding the assembly at a temperature in the range of 120 to 140° C. (below the melting point of Parylene C), and then retracting the stamp/mold from the assembly. The stamp/mold produces breaks in the thin gold film at lines of discontinuity in the topography of the stamp/mold. This technique has been used before to facilitate the removal of selected portions of a metal film, but the use of this kind of technique in the embodiments of the present invention is characterised by retaining portions from the conductor layer (e.g. thin gold film) at three different levels in an array of transistors. In one example, the stamping/molding may be carried out as part of a roll-to-roll or spool-to-spool production process.

In the process described above, the source and drain conductors are defined without using any photolithographic technique, and without any wet etching.

Figure 4A:
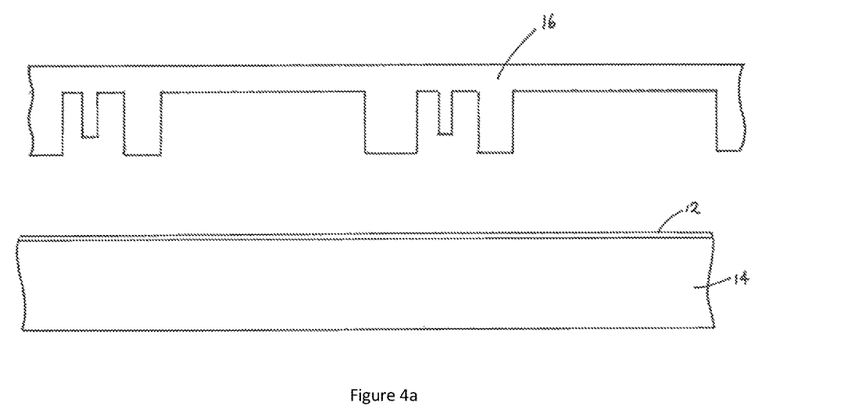
FIGS. 4(a) to 4(e) illustrate one example of a technique for producing a transistor array including the conductor array of FIG. 1.
Figures 4B, 4C:
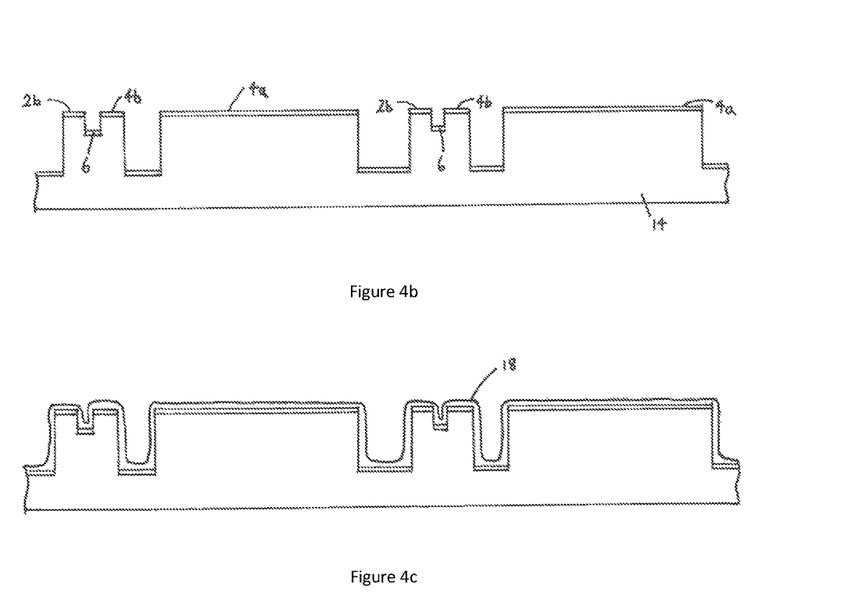
Figure 4D:
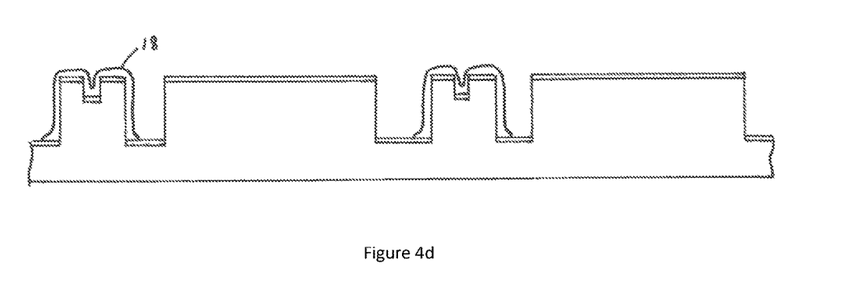
Figure 4E:
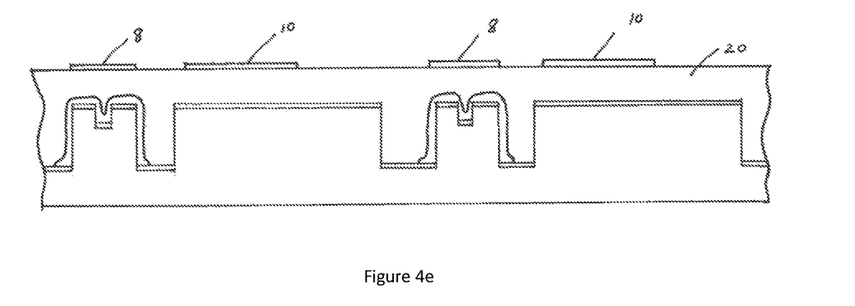

Semiconductor channel material is deposited over the resulting structure by a technique that produces a layer of semiconductor material 18 that substantially conforms to the topography of the underlying structure. The semiconductor channel material layer 18 is then patterned to form semiconductor islands (FIG. 4(*e*)) so as to better prevent unwanted leakage currents between conductors via the semiconductor layer. The semiconductor channel material may, for example, be an organic polymer material, and the deposition technique may be spin coating.

The deposition of the semiconductor channel material may be preceded by one or more steps to improve the movement of charge carriers between one or more of the source and drain conductors and the semiconductor channel material. An example of one conventional technique involves forming a self-assembled monolayer (SAM) of suitable organic material on the source and drain conductors 2, 4 by a e.g. a technique that also results in formation of a SAM on the conductor islands 6 and on the further conductor elements at the third level.

Each conductor island 6 is connected to the respective associated pair of source and drain electrodes 2b, 4b (i.e. the pair of source and drain electrode between which the conductor island 6 lies at the second level) by a respective semiconductor island. It may be preferable to have only a short inter-level distance between the upper first and middle second levels in order to achieve a short channel length between the source and drain electrodes 2b, 4b of each transistor; and the retention of the conductor islands 6 may further improve the transport of charge carriers between the source and drain electrodes when the transistor is in an "on" state.

In contrast, it may be preferable to have a relatively large inter-level distance between the middle second and lower third levels in order to better avoid unwanted leakage currents, i.e. currents between source and drain conductors 2, 4 other than in the channel regions, particularly in regions underlying the gate conductors 8 but outside the channel regions. In one embodiment, the inter-level distance between the upper first and middle second levels is less than the distance between the middle second and lower third levels.

A gate dielectric layer or a stack of gate dielectric layers 20 are then formed over the resulting structure. A second conductor layer is then deposited over the gate dielectric layer(s) and patterned (by e.g. photolithography or laser ablation) to form (i) gate lines 8 each extending over the channel regions of a respective row of transistors and (ii) common voltage lines (COM lines) 10 each extending over the large area drain conductors 4a of a respective row of transistors for capacitative coupling with those large area drain conductors. The COM lines 10 are all connected to a common power supply terminal. The second conductor layer may also comprise a metal layer.

Further layers (not shown) may be formed over the second conductor layer such as an insulating passivation layer, and an array of pixel conductors formed over the insulating passivation layer and each connected via a respective interlayer connection through the passivation layer and the gate dielectric to a respective drain conductor 4a. Each pixel conductor may, for example, be used to control a respective pixel portion of an optical medium such as a light-emissive material, an electrophoretic material or a liquid crystal material.

Figure 5:
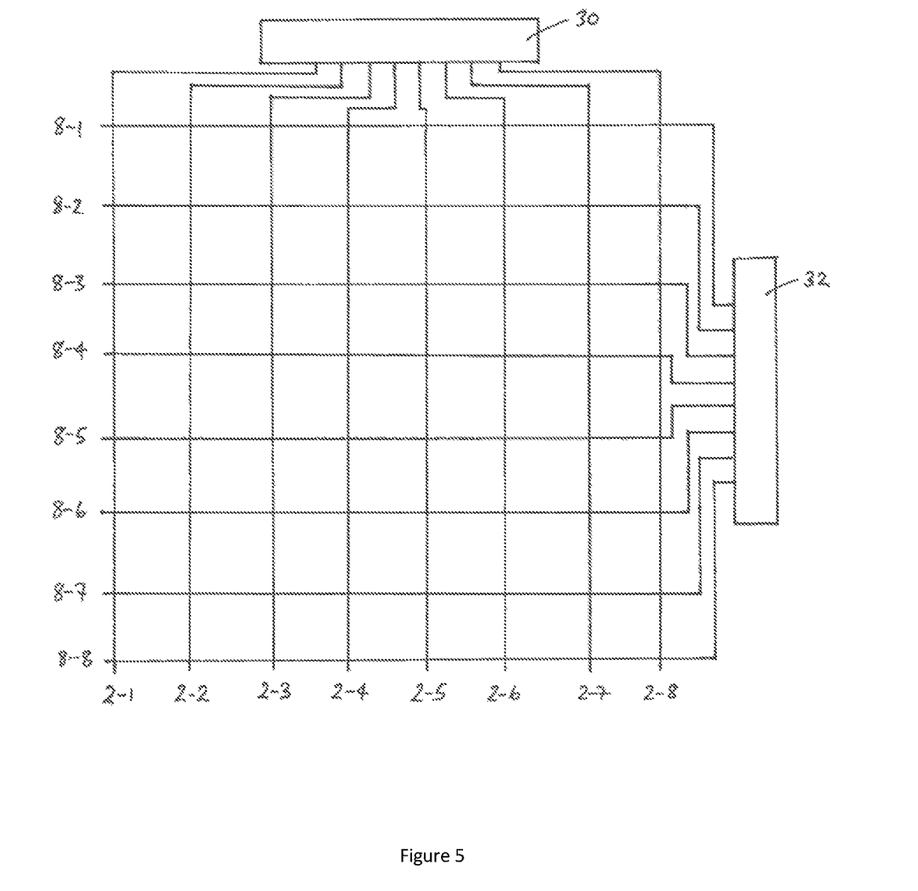
FIG. 5 schematically illustrates the connection of source and gate conductors to driver chips.

As schematically shown in FIG. 5, each source line conductor 2 is connected to a respective terminal of one or more source driver chips 30 and each gate conductor 8 is connected to a respective terminal of one or more gate driver chips 32. Each transistor is associated with a unique combination of source and gate conductors 2, 8, whereby the potential at each drain conductor 4 can be controlled independently of all other drain conductors. The driver chips 30, 32 may be located, for example, on the same support substrate (e.g. plastic film) as that on which the transistor array is formed, or on separate components later connected to routing conductors provided on the same support substrate as the transistor array.

The above-described example involves the creation of three metal levels from a single conductor layer, but the same kind of technique may be used to create four or more metal levels from a single conductor layer.

In addition to the modifications explicitly mentioned above, it will be evident to a person skilled in the art that various other modifications of the described embodiment may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

The invention claimed is:

1. A method of producing a transistor array, comprising an array of addressing conductors each providing the source electrodes of a respective set of transistors and at least part of a conductive connection between a respective driver terminal and said source electrodes; wherein the method comprises:
    forming a conductor layer on a first side of a substrate including a deformable layer;
    displacing a plurality of portions of said conductor layer and underlying portions of said deformable layer relative to other portions of said conductor layer and said deformable layer to produce breaks in said conductor layer and create from said conductor layer at least (i) said array of addressing conductors and an array of drain conductors at a first level, (ii) conductor element islands in transistor channel regions at a second level, and (iii) one or more further conductor elements at a third level; and
    thereafter depositing semiconductor channel material over the conductor layer; wherein said first, second and third levels are at different heights relative to a second side of the substrate opposite to the first side of the substrate.

2. The method according to claim 1, wherein the second level is between the first and third levels.

3. The method according to claim 2, wherein the distance between the first and second levels is smaller than the distance between the second and third levels.

4. The method according to claim 1, further comprising: depositing a substantially continuous layer of the semiconductor channel material over the arrays of source and drain conductors, the conductor element islands and the further conductor elements; and selectively decreasing the conductivity of the layer of semiconductor channel material in one or more regions over the one or more further conductor elements at the third level.

5. The method according to claim 4, wherein selectively decreasing the conductivity of the layer of semiconductor channel material in one or more regions over the one or more further conductor elements comprises removing portions of the layer of semiconductor channel material in one or more regions over the one or more further conductor elements.

6. The method according to claim 4, further comprising forming a gate dielectric layer or stack of gate dielectric layers over at least the semiconductor islands, and forming an array of gate conductors over the gate dielectric layer or stack of gate dielectric layers for capacitative coupling with the semiconductor islands in at least the channel regions.

7. A method according to claim 1, wherein said conductor layer comprises a metal layer, and said deformable layer comprises a thermoplastic resin layer.

8. A transistor array, comprising a stack of layers on a first side of a substrate, wherein the stack of layers defines:
    a first conductor pattern at a first level defining an array of source and drain conductors, each source conductor providing the source electrodes of a respective set of transistors and an addressing line forming at least part of a conductive connection between a respective driver terminal and said source electrodes;
    a second conductor pattern at a second level defining an array of conductor islands in channel regions; a third conductor pattern at a third level,
        wherein the first, second and third conductor patterns form a complementary set of patterns; and
        wherein any two of the first, second and third conductor patterns exactly match gaps in the other of the first, second and third conductor patterns, without any overlap of the first, second and third conductor patterns;
    semiconductor channel material extending over the first conductor pattern and providing semiconductor channels between source and drain conductors in said channel regions; and
    one or more gate conductors capacitatively coupled to said semiconductor channels via a gate dielectric;
        wherein the first, second and third levels are at different heights relative to a second side of the substrate opposite to said second side of the substrate, which wherein there is no conductive connection between any two of the three levels within said stack of layers.

9. The transistor array according to claim 8, wherein the second level is between the first and third levels.

10. The transistor array according to claim 9, wherein the distance between the first and second levels is smaller than the distance between the second and third levels.

11. A transistor array according to claim 8, comprising at least one gate dielectric layer extending continuously over the first, second and third conductor patterns.

12. A transistor array according to claim 8, wherein said conductor layer comprises a metal layer, and said deformable layer comprises a thermoplastic resin layer.

13. A transistor array, comprising a stack of layers on a first side of a substrate, which stack of layers defines:
    a plurality of conductor patterns at a plurality of levels, wherein said plurality of conductor patterns comprises a combination of three or more complementary conductor patterns at three or more levels,
        wherein each of the three or more complementary conductor patterns includes conductor material only in regions where conductor material is absent in all other conductor patterns of the three or more complementary conductor patterns; and
        wherein a first conductor pattern of said three or more complementary patterns defines an array of source and drain conductors, each source conductor providing the source electrodes of a respective set of transistors and an addressing line forming at least part of a conductive connection between a respective driver terminal and said source electrodes;
    a second conductor pattern of said three or more complementary conductor patterns defines an array of conductor islands in channel regions; and
    wherein the transistor array further comprises semiconductor channel material extending over the first conductor pattern and providing semiconductor channels between source and drain conductors in said channel regions and one or more gate conductors capacitatively coupled to said semiconductor channels via a gate dielectric, wherein said three or more levels are at different heights relative to a second side of the substrate opposite to the first side of the substrate wherein there is no conductive connection between any two of the three levels within said stack of layers.

14. A transistor array according to claim 13, wherein said three or more complementary conductor patterns comprise said first conductor pattern at a first level, said second conductor pattern at a second level, and a third conductor pattern at a third level; wherein the first conductor pattern includes conductor material only in regions where conductor material is absent in both the second and third conductor patterns; the second conductor pattern includes conductor material only in regions where conductor material is absent in both the first and third conductor patterns; and the third conductor pattern includes conductor material only in regions where conductor material is absent in both the first and second conductor patterns.

15. The transistor array according to claim 14, wherein the second level is between the first and third levels.

16. The transistor array according to claim 15, wherein the distance between the first and second levels is smaller than the distance between the second and third levels.

17. A transistor array according to claim 13, comprising at least one gate dielectric layer extending continuously over the first, second and third conductor patterns.

18. A transistor array according to claim 13, wherein said conductor layer comprises a metal layer, and said deformable layer comprises a thermoplastic resin layer.

* * * * *